Figure 1:
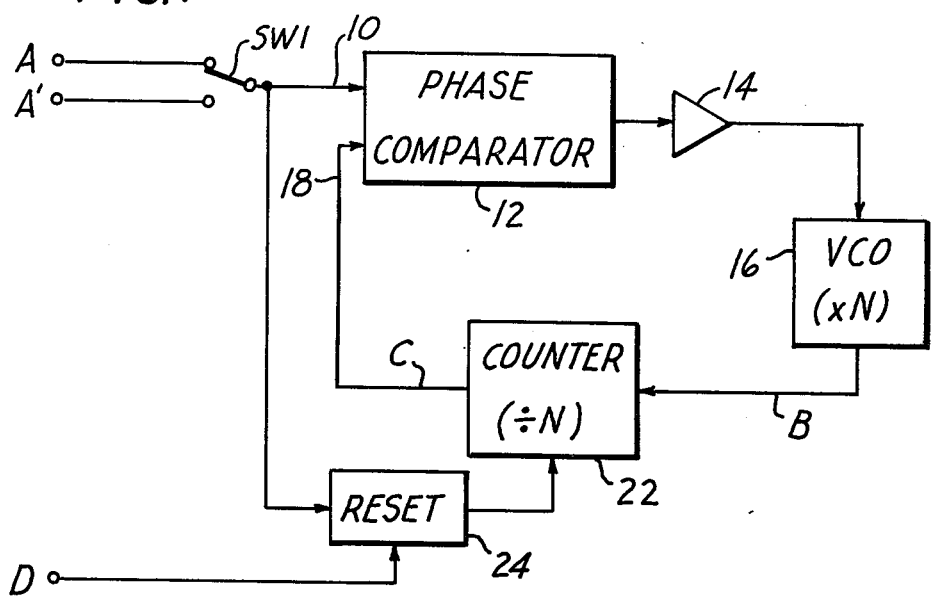

United States Patent [19]

Hunnicutt et al.

[11] 4,005,479
[45] Jan. 25, 1977

[54] PHASE LOCKED CIRCUITS
[75] Inventors: Roger Hunnicutt, Bloomington; Beat G. Keel, Prior Lake, both of Minn.
[73] Assignee: Control Data Corporation, Minneapolis, Minn.
[22] Filed: Jan. 16, 1976
[21] Appl. No.: 649,953
[52] U.S. Cl. .............................................. 360/51
[51] Int. Cl.² ....................................... G11B 5/09
[58] Field of Search ................... 360/51, 39, 53
[56] References Cited
UNITED STATES PATENTS

| | | | |
|---|---|---|---|
| 3,778,793 | 12/1973 | Hayashi et al. | 360/51 |
| 3,898,690 | 8/1975 | Desai | 360/51 |
| 3,900,890 | 8/1975 | Eibner | 360/51 |

Primary Examiner—Vincent P. Canney
Attorney, Agent, or Firm—Robert M. Angus

[57] ABSTRACT

A phase locked circuit according to the present invention includes means for multiplying a signal to be phase locked by an integer N. A resettable divide counter divides the multiplied signal by N for return to a phase comparator. Reset means operates the resettable counter upon command so that when the input signal to the phase locking circuit is changed (i.e., between two signals each having approximately the same frequency but which may be out of phase), the reset means is operated to reset the divide counter so that the maximum phase error if the signal delivered to the phase comparator is $\pi/N$ radians.

8 Claims, 2 Drawing Figures

PHASE LOCKED CIRCUITS

This invention relates to phase locking circuits, and particularly to phase locked circuits capable of reducing phase error in a clock signal.

In the magnetic recording data recovery art, the READ and NOT READ signal frequencies are often not quite in phase synchronism. As a result, each time a transition occurs between READ and NOT READ modes, the clock signal associated with the phase locked loop must be resynchronized to the input signal. Thus, while the READ and NOT READ signals may be approximately the same frequency, they may be phase shifted, thereby requiring a resynchronization of the phase of the clock signal to the phase of the READ or NOT READ signals. Heretofore, resynchronization of the clock signal to the READ and NOT READ signal frequencies has been accomplished by a "zeroing out" of the frequency differences, usually through a phase comparator and voltage controlled oscillator. However, this process ordinarily requires up to 20 clock cycles, thereby introducing a delay upon the transition between the READ and NOT READ modes.

Another technique for resynchronizing signals has resided in the use of an oscillator capable of starting and stopping oscillation within one cycle, and inhibiting that oscillator for a predetermined period of time to make up for phase differences between the old and new signals being locked. However, this technique required a special oscillator which usually had poor spectral quality and tended to degrade overall system performance.

The present invention is concerned with apparatus for resynchronizing the clock in a shorter period of time. Particularly, the frequency of the input signal (either the READ or NOT READ signal) is multiplied by N to derive a signal whose frequency is N times the signal frequency of the READ or NOT READ signal frequency. A divide counter divides the multiplied signal by N to regenerate the original signal frequency. When resynchronization is desired, such as on a transition between the READ and NOT READ modes, the divide counter is reset so that the clock is immediately resynchronized to a phase close to that of the new input signal so that the maximum error possible is $\pi/N$ radians. Thereafter, final resynchronization of the signal is accomplished by prior art techniques utilizing a phase comparator and voltage controlled oscillator.

It is an object to the present invention to provide synchronization apparatus capable of rapidly resynchronizing one signal frequency to another.

It is another object of the present invention to provide a pulse resynchronization apparatus capable of resynchronizing a pulse signal frequency to an input frequency upon a change in the phase of such input frequency.

According to the present invention, a voltage controlled oscillator provides a signal whose frequency is N times the input frequency. A divide counter is connected to the output of the voltage controlled oscillator to divide the signal by N for delivery of a signal to a phase comparator having the same frequency as the input. Reset means is provided for resetting the divide counter upon a change of the signal input which may result in a shift of the phase of such signal input so that the output signal from the divide counter to the phase comparator is at the same frequency as the signal input but the maximum error in phase shift can be no greater than $\pi/N$ radians.

One feature of the present invention resides in the use of the invention in magnetic recording data recovery circuitry for rapid resynchronization of a clock signal to the READ and NOT READ signal frequencies.

Figure 2:
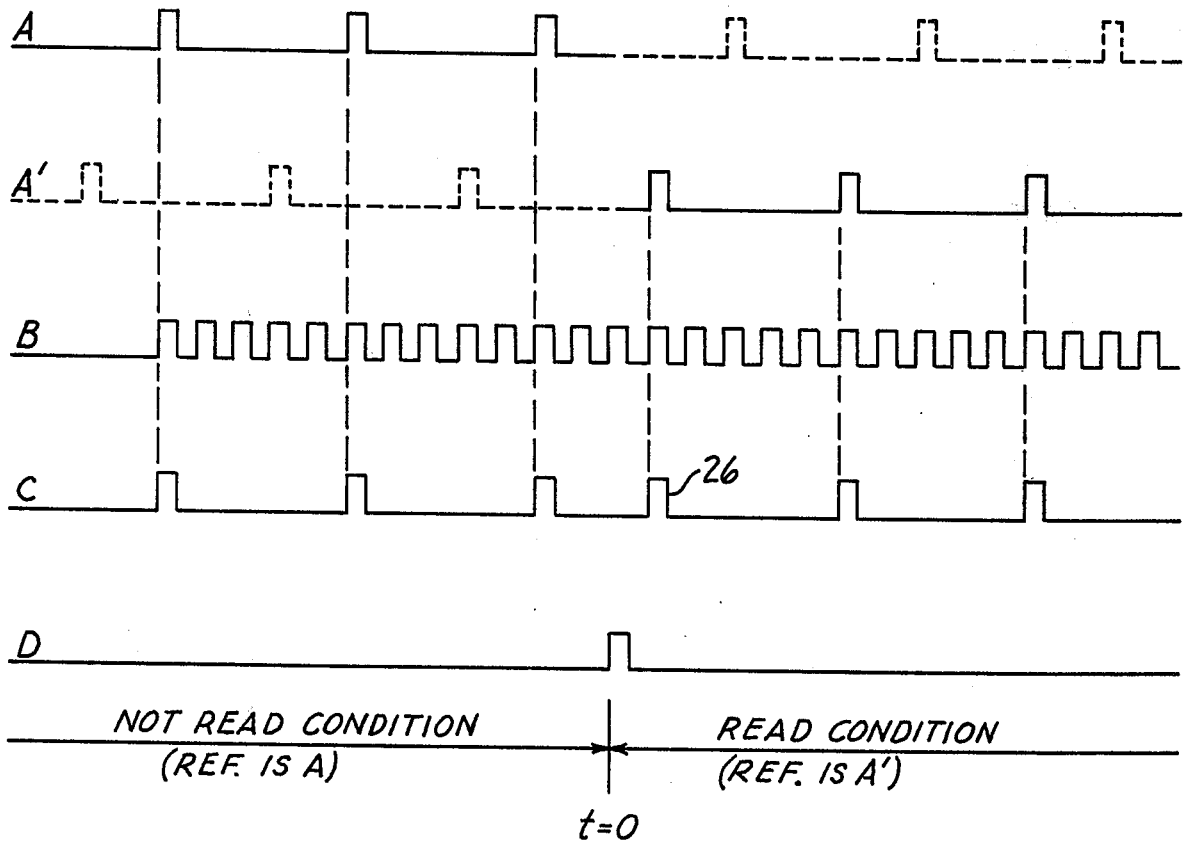

The above and other features of this invention will be more fully understood from the following detailed description and the accompanying drawings, in which:

FIG. 1 is a clock circuit diagram of apparatus in accordance with the presently preferred embodiment of the present invention; and FIG. 2 is a representation of various waveforms of the signals passing through the circuitry illustrated in FIG. 1.

With reference to the drawings, in particular FIG. 1, there is illustrated a phase locking circuit in accordance with the presently preferred embodiment of the present invention. As illustrated in FIG. 1, a switch SW 1 has terminals connected to receive READ and NOT READ signals, designated A and A' respectively. Signals A and A' ordinarily have identical frequencies, but may be phase shifted from each other by some unknown amount. The pole of switch SW 1 is connected to a first input 10 of phase comparator 12. The output from phase comparator 12 is connected through filter amplifier 14 to voltage controlled oscillator 16. In the prior art, the output from voltage controlled oscillator 16 was connected directly to input 18 of phase comparator 12. Thus, in the prior art, when switches SW 1 was moved between its first and second positions to switch between signal input A and A', the phase comparator determined the phase shift between the output from the voltage controlled oscillator and the new input signal, and working with the voltage controlled oscillator sought resynchronization of the signal phase, a process which ordinarily required up to about 20 clock cycles. In the present invention, however, the voltage controlled oscillator 16 is set to provide an output signal B (FIG. 2) at a frequency of N times the input frequency. Divide counter 22 receives a signal B as an input to divide signal B by N to provide output signal C to be delivered to input 18 of phase comparator 12. Counter 22, which for example, may be a resettable shift register, is resettable upon command from reset circuit 24, which in turn receives the input signals A or A' from switch SW 1 as well as a resynchronization command signal D. It will be appreciated that N is preferably an integer so that the divider counter is made as simple as possible. However, it is possible that N can be any pre-selected number, although a more complicated divider would then be necessary in lieu of a mere counter.

In operation of the apparatus according to the present invention, and with reference particularly to FIG. 2, let it be assumed that the switch SW 1 is in the position illustrated in FIG. 1, so that phase comparator 12 is receiving signal A at its input 10. Let it further be assumed that the clock pulses are in synchronization with the input signal A and for purposes of illustration, let it further be assumed that N has a value of 5. Filter 14 provides an output voltage having a voltage level representative of the frequency of the input signal A or A'. Voltage controlled oscillator 16 provides an output signal B at N times signal A or A', which for the present example, it will be appreciated that output signal B from voltage controlled oscillator 16 has a signal frequency equal to 5 times the signal frequency of signal A. Therefore, resettable divide counter 22, which is heretofore explained, may be a resettable shift register, provides a pulse output signal illustrated at C equal to one-fifth of the signal frequency of signal B. Thus, it is shown in the left portion of FIG. 2, signal C is exactly in phase and frequency synchronization with signal A.

When it is desirable to switch between the READ and NOT READ modes, switch SW 1 is operated so that signal A' is delivered to the input 10 of phase comparator 12. At the same time, a resynchronization pulse D is provided to reset circuit 24. Voltage controlled oscillator 16, however, continues to provide output signals so signal B continues unaltered, at least for the time being. When the first pulse from signal A' is received by reset counter 24, reset circuit 24 provides a reset signal to divide counter 22, thereby resetting that counter to zero, regardless of whatever count may have already been in that counter. Upon reset to zero, divide counter 22 provides a pulse illustrated at 26 in signal C and thereafter continues to divide the frequency of signal B by N, which in this case equals 5. Thus, resynchronizaton to signal A' is accomplished immediately with an error factor no greater than $\pi/N$ radians. It will be appreciated that upon transition between signal A and A', a pulse from signal B is selected for signal C which is closest to the phase of the new signal frequency. Consequently, the maximum error that can occur upon resynchronization is $\pi/N$ radians instead of $\pi$ radians as heretofore known in the prior art. Final resynchronization can be accomplished through prior art techniques utilizing the phase comparator and voltage controlled oscillators 12 and 16, respectively, as well known in the art. Hence, the apparatus according to the present invention reduces the maximum error by a factor equal to N.

While N may be selected as any desired integer it will be appreciated by those skilled in the art that N should not be selected too high due to the cost of the redundant circuitry necessary for the shift register, and it has been found that a multiplication factor in the range of about 5-10 is sufficient. Therefore, with N selected as an integer in a range between 5 and 10, the maximum error in the phase would be between 36° and 18° instead of 180° as associated with apparatus known in the prior art.

The present invention thus provides apparatus which effectively reduces the maximum error in phase resynchronization and is particularly useful in the magnetic recording data recovery art. The apparatus is simple and rapid in operation.

This invention is not to be limited by the embodiment shown in the drawings and described in the description, which is given by way of example and not of limitation, but only in accordance with the scope of the appended claims.

What is claimed is:

1. In a phase lock circuit having a phase comparator having a first input for receiving one of a plurality of signals each having the same frequency but whose phase may be different in relationship to each other, the improvement comprising: multiplier means connected to the output of said phase comparator for multiplying the frequency of the signal appearing at said first input by N, where N is a predetermined amount; resettable divide means connected to said multiplier means for dividing the multiplied signal from said multiplier means by N; reset means for resetting said divide means upon a change of selection of input signals to said first input of said phase comparator, whereby upon change of selection of input signals to said first input of said phase comparator, said divide means provides pulse signals at a frequency equal to said input signal and at a phase which differs from the phase of said input signal by an amount no greater than $\pi/N$ radians; and means connecting the output of said divide means to a second input of said phase comparator.

2. Apparatus according to claim 1 wherein said divide means comprises a counter, and N is an integer.

3. Apparatus according to claim 1 wherein said multiplier means includes filter means connected to the output of said phase comparator for deriving a signal whose voltage is representative of the signal appearing at said first input, and voltage controlled oscillator means responsive to the voltage of said last-named signal for deriving a signal whose frequency is a predetermined multiple of the signal appearing at said first input.

4. Apparatus according to claim 3 wherein said divide means comprises a counter, and N is an integer.

5. A phase locked circuit for resynchronizing a clock signal of a data recovery system to the phase of an input signal selected from the group consisting of a READ signal and a NOT READ signal, comprising: phase comparator means for comparing the phase of signals appearing at first and second inputs; switch means connected to said first input for selectively connecting a source of READ signals or a source of NOT READ signals to said first input; oscillator means connected to receive signals from said phase comparator means for producing signals at a frequency set to a predetermined multiple of the frequency of the signal received at said first input; resettable divide means connected to receive the signal from said oscillator means for dividing said signal by said predetermined amount; means for connecting the divided signal from said divide means to said second input of said phase comparator means; and reset means for resetting said divide means when said switch means is operated to change the source of input signals connected to said first input between said READ and NOT READ signals.

6. Apparatus according to claim 5 wherein said divide means is a resettable counter.

7. Apparatus according to claim 5 wherein said oscillator means includes filter means for deriving a signal whose voltage is representative of the frequency of the signal received at said first input, and voltage controlled oscillator means connected to said filter means and responsive to said voltage for producing signals at a frequency set to a predetermined multiple of the frequency of the signal received at said first input.

8. Apparatus according to claim 7 wherein said divide means is a resettable counter.

* * * * *